United States Patent [19]

Greenwood

[11] 4,406,986

[45] Sep. 27, 1983

[54] AUXILIARY DC FIELD COIL FOR IMPROVING RATE BIAS INSTABILITY OF MAGNETIC RESONANCE GYROSCOPES

[75] Inventor: Ivan A. Greenwood, Stamford, Conn.

[73] Assignee: The Singer Company, Little Falls, N.J.

[21] Appl. No.: 255,619

[22] Filed: Apr. 20, 1981

[51] Int. Cl.³ .............................................. G01R 33/08
[52] U.S. Cl. .................................................... 324/304
[58] Field of Search ............... 324/300, 304, 307, 318, 324/320

[56] References Cited

U.S. PATENT DOCUMENTS

| | | | |
|---|---|---|---|
| 3,577,068 | 5/1971 | La Force | 324/304 |
| 3,652,926 | 3/1972 | Brun | 324/304 |
| 3,725,775 | 4/1973 | Gasser | 324/304 |
| 3,778,700 | 12/1973 | Bayley | 324/304 |
| 3,863,144 | 1/1975 | Simpson | 324/304 |
| 4,147,974 | 4/1979 | Greenwood | 324/304 |

*Primary Examiner*—Michael J. Tokar
*Attorney, Agent, or Firm*—Morris Liss; Thomas W. Kennedy

[57] ABSTRACT

A magnetic resonance gyroscope has auxiliary coils mounted adjacent the coils which normally produce the DC $H_o$ field for the gyro spin generators. The auxiliary coils establish an inhomogeneous $H_o$ field which results in a reduction of the rate bias shifts due to readout lamp plasma shifts. Alternately, rate bias shifts may be reduced by introducing a temperature differential between the two absorption cells employed in the gyro.

10 Claims, 5 Drawing Figures

AUXILIARY DC FIELD COIL FOR IMPROVING RATE BIAS INSTABILITY OF MAGNETIC RESONANCE GYROSCOPES

The Government has rights in this invention pursuant to Contract No. N00019-80-C-0086 awarded by the Department of the Navy.

FIELD OF THE INVENTION

The present invention relates to magnetic resonance gyroscopes and more particularly to an apparatus employed in the readout beam section of the gyroscope for reducing the rate bias shift due to readout lamp plasma shifts.

BRIEF DESCRIPTION OF THE PRIOR ART

Magnetic resonance glyroscopes are well established in the art. A basic configuration for such a gyroscope is described in U.S. Pat. No. 3,778,700, assigned to the present assignee. In a gyroscope of the type described, a readout plasma lamp is employed as a source of light which undergoes beam splitting and subsequent redirection through a pair of absorption cells filled with isotopes of Hg. The lamp is dumbbell shaped, with the intermediate connecting portion of the lamp containing plasma. Because the readout beam originates from an extended source, any changes in the source may produce polarization, beam division, and beam direction effects in the gyro which are major sources of rate bias instability. Lamp plasma shifts can occur due to factors including electrical changes in the RF lamp driving system, movement of the lamp and/or coil position, changes in the magnet position, temperature changes in the lamp housing, plasma striation phenomena, or magnetic deflections of the plasma due to movement of the magnet.

A number of corrections have been attempted previously with limited success in decreasing the effects of these sources of rate bias instability. However, such corrections have generally resulted in a decrease of signal-to-noise ratio.

BRIEF DESCRIPTION OF THE PRESENT INVENTION

The present invention utilizes auxiliary coils, which are placed in close proximity to the coils generating the DC field $H_o$ for an absorption cell. This results in the creation of an inhomogeneous $H_o$ field which corrects the rate bias instability. This is achieved without a compromise of the signal-to-noise ratio.

An alternate correction is achieved by accomplishing a temperature differential between the absorption cells to an extent resulting in substantial decrease of rate bias instability.

The above-mentioned objects and advantages of the present invention will be more clearly understood when considered in conjunction with the accompanying drawings, in which:

DETAILED DESCRIPTION

Figure 1:
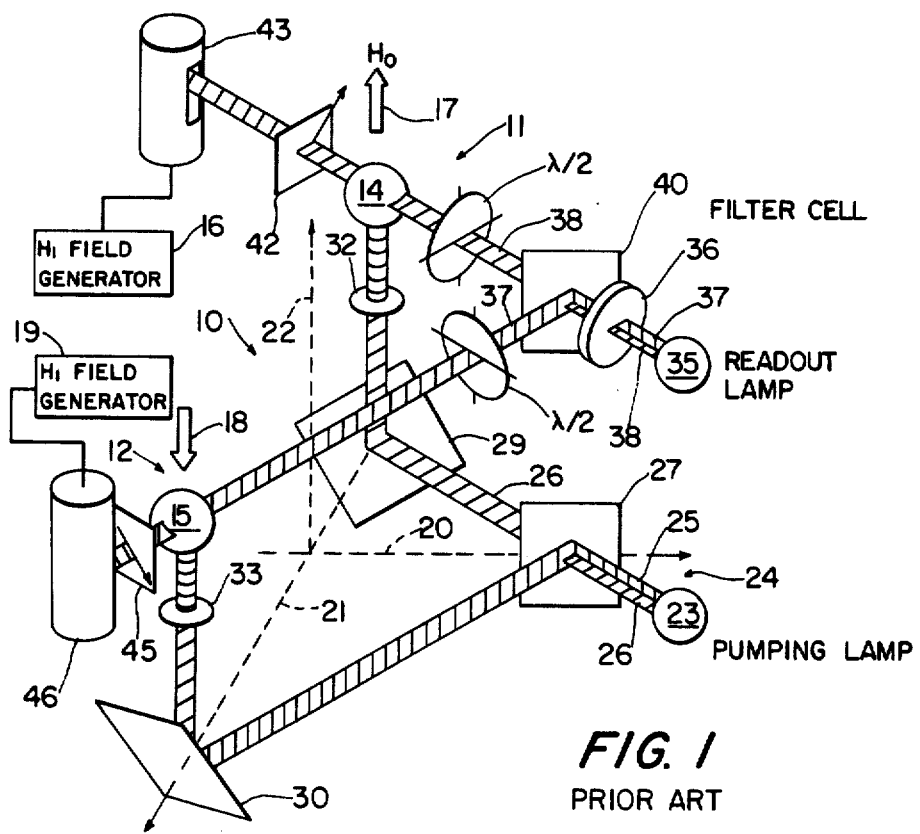
FIG. 1 is a schematic view of the prior art illustrating the central components of a magnetic resonance gyro arranged in the proper geometrical relationship.
Figure 2:
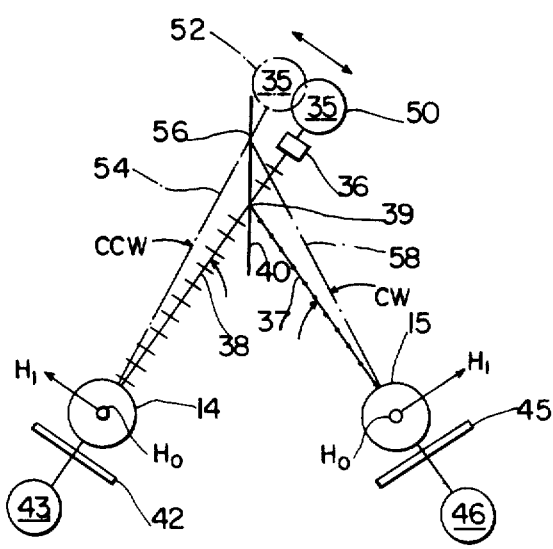
FIG. 2 is a schematic of the readout beam shown for the prior art of FIG. 1.

Prior to an explanation of the improvement in magnetic resonance gyros as discussed in the following text in connection with FIGS. 3–5, it will be instructive to review the general structure of a prior art gyro as shown in FIGS. 1 and 2.

FIG. 1 illustrates a basic configuration of a prior art gyroscope as described in U.S. Pat. No. 3,778,700, assigned to the present assignee. The gyroscope is generally indicated by reference numeral 10 and comprises a first spin generator designated generally by the reference numeral 11 and a second spin generator designated generally by the reference numeral 12. Each spin generator acts as a basic sensing unit for the gyroscope and serves as an oscillator which effectively simultaneously operates at two frequencies $\omega_1$ and $\omega_2$. The output frequencies of each spin generator are influenced by the rate of rotation of the gyroscope about the predetermined sensitive axis 22 so that the angle of rotation is added algebraically to the phase of each oscillation from the spin generator. Each output frequency of each spin generator is proportional to its magnetic field, $H_o$, so that the ratio of the frequencies in each spin generator remains constant in the absence of rotation.

The phases of the oscillation signals from each spin generator are given by the following equations:

$$\phi_{11} = \int \gamma_1 H_{01} dt + \phi_0$$
$$\phi_{21} = \int \gamma_2 H_{01} dt - \phi_0 \quad (1)$$
$$\phi_{12} = \int \gamma_1 H_{02} dt - \phi_0$$
$$\phi_{22} = \int \gamma_2 H_{02} dt + \phi_0 \quad (1)$$

where $\gamma_1$ and $\gamma_2$ are the absolute gyromagnetic ratios of the Hg nuclei in the absorption cell; $H_{01}$ and $H_{02}$ are the respective magnetic fields proportional to the current applied to the coils which produce the fields; $\phi_0$ is the common angle of rotation of the spin generators about the predetermined sensitive axis; $\phi_{11}$ and $\phi_{21}$ are the phases of the output signals from spin generator 11 and $\phi_{12}$ and $\phi_{22}$ are the phases of the output signals of spin generator 12; $\phi_{11}$ and $\phi_{12}$ are the phases of the signals whose frequency is $\omega_1$, while $\phi_{21}$ and $\phi_{22}$ are the phases of the signals whose frequency is $\omega_2$.

The angle of rotation is obtained by comparing the phases of pairs of signals. Neglecting error terms, if the phase difference in the signals of one frequency from the two spin generators is maintained equal and opposite in sign to the phase difference between the signals of the other frequency, the phase difference at either frequency is twice the angle of rotation of the gyroscope about the sensitive axis. Thus, if $$(\phi_{11} - \phi_{12}) + (\phi_{21} - \phi_{22}) = 0 \quad (2)$$

then $$\phi_{11}-\phi_{12}=2\phi_0 \text{ and } \phi_{21}-\phi_{22}=2\phi_0 \qquad (3)$$

The condition of equation (2) above may be maintained by developing an error signal from the sum of the respective phase differences of the corresponding outputs from the two spin generators. Th error signal is used as a differential control signal to control the current through one or more coils which generates the $H_o$ magnetic fields to maintain the error signal at a null. This forces $H_{01}$ to equal $H_{02}$.

The gyroscope 10 includes circuitry (not shown) for comparing the phases of the output signals from the two spin generators 11 and 12 and for generating control and output signals as described above. The output signal produced is proportional to the angle of rotation of the gyroscope 10 about the sensitive axis.

The spin generator 11 includes an optically pumped and an optically monitored magnetic resonance element which comprises a coil assembly (not shown in FIG. 1) having a mercury absorption cell 14 at its center. Similarly, the spin generator 12 includes a mercury absorption cell 15 located at the center of a multiple coil assembly (not shown in FIG. 1). A first field coil (shown in FIGS. 3 and 4) generates a DC magnetic $H_o$ field designated generally by the reference numeral 17, for the spin generator 11 while a second field coil of the same type as the first generates a second DC magnetic $H_o$ field, designated generally by the reference numeral 18, for the spin generator 12.

For clarity, the orientation of the components in the apparatus shown in FIG. 1 will be related to an arbitrary x, y, z-axis coordinate system to aid in visualizing the spatial relationship of the components and to indicate the polarization of the pumping and readout light beams which will be described in detail. The x, y, and z-axes are designated generally by the reference numerals 20, 21 and 22, respectively. Thus, the $H_o$ field 17 is in the positive z direction, while the $H_o$ field 18 is in the negative z direction, so that the field 18 is thus antiparallel to the field 17.

Each of the mercury absorption cells 14 and 15 preferably contains two odd isotopes of mercury, i.e., $^{199}$Hg and $^{201}$Hg. When the DC $H_o$ magnetic field has a strength of about 1.3 gauss, the resonance frequency of $^{199}$Hg is approximately 1 kHz and the resonance frequency of $^{201}$Hg is about 369 Hz. When each mercury cell is illuminated by light in a waveband having a nominal optical center at 253.7 nm, the mercury atoms in the cell may absorb light in this region and be excited from the ground state to the first excited level by any light at a wavelength which is in resonance with transitions from the ground state mercury atoms in the mercury cell.

The ground state atoms of mercury in each absorption cell possess magnetic moments due only to their intrinsic nuclear angular momentum or spin properties, since all electronic moments cancel out. When a collection or ensemble of such spins is subjected to the influence of a substantially homogenous static magnetic field $H_o$, the orientations of the magnetic moments will be quantized or split into a series of ground states or levels having predeterminable energy separations. In the absence of very strong magnetic fields or optical pumping, the moments are randomly distributed and produce no net magnetic moment. A macroscopic magnetic moment may be produced in the mercury vapor by the process of optical pumping. Circularly polarized light of precise wavelengths to be absorbed by the mercury atoms adds its angular momentum to the mercury atoms when it is absorbed. Some of this angular momentum remains behind when the excited atoms reemit the absorbed electronic excitation energy. This corresponds to a redistribution of population among the ground state magnetic quantum levels. For $^{199}$Hg, there are only two such levels, $m_I = \pm \frac{1}{2}$, and any asymmetry of populations corresponds only to an orientation moment, with a resultant macroscopic nuclear magnetic moment. For $^{201}$Hg, having a nuclear spin of 3/2, there are four levels, $m_I = \pm 3/2$ and $\pm \frac{1}{2}$. For such atoms, the orientation moment is proportional to $3(n_{+3/2} - n_{-3/2}) + (n_{\frac{1}{2}} - n_{-\frac{1}{2}})$, where the n's represent the populations in the respective magnetic levels. Again, the orientation moment is observable as a net magnetic moment. There is also an alignment moment proportional to $(n_{3/2} + n_{-3/2}) - (n_{\frac{1}{2}} + n_{-\frac{1}{2}})$. The alignment moment leads to a variety of effects in the magnetic resonance gyro, most of them tending to produce errors in rate.

A pumping lamp 23 provides a beam 24 of randomly polarized absorbable light which may be resolved into components polarized in a first plane designated by the numeral 25 and in a second plane designated by the numeral 26. The light output from the lamp 23 is directed upon a Brewster angle polarizer 27 which also acts as a beam splitter. The components of the light in the plane 26 are transmitted therethrough and are reflected from a mirror 29 in a direction parallel to the z axis 22. The components of the light in the plane 25 are reflected from the Brewster angle polarizer 27 and are reflected from the mirror 30 in a direction parallel to the z axis 22. The linearly polarized light reflected from the mirror 29 is circularly polarized by the quarter wave plate 32 and intersects the mercury absorption cell 14, where it performs the function of optical pumping. The linearly polarized light reflected from the mirror 30 is circularly polarized by the quarter wave plate 33 and intersects the mercury absorption cell 15, producing optical pumping in this cell.

A readout lamp 35 produces a beam of randomly polarized off-resonance light which contains components of light polarized in the plane designated by the reference numeral 37 and light polarized in the plane designated by the reference numeral 38. The beam from the lamp 35 undergoes filtering by a filter cell 36 containing $^{199}$Hg and $^{201}$Hg atoms. The filtered beam then intersects the Brewster angle polarizer 40 which transmits the components of light polarized in the plane 38 to intersect the mercury cell 14. Similarly, the components of light polarized in the plane 37 in the readout beam are reflected from the Brewster angle polarizer 40 and intersect the mercury absorption cell 15.

The geometry shown in FIG. 1 is determined in large part by the Brewster angle. Preferably, each Brewster angle polarizer is made from stacks of thin plates of fused silica. When the incident light beam is at the Brewster angle, the reflected light beam is linearly polarized with its electric vector parallel to the plane of the reflecting surface and the transmitted beam is partially linearly polarized perpendicularly to the polarization of the reflected beam.

Each of the mercury absorption cells 14 and 15 is also subjected to an AC $H_1$ field produced by field coils (not shown). The $H_1$ fields are perpendicular to the $H_o$ fields and the readout beams, as shown in FIG. 2.

The $H_1$ field applied to cell 14 is produced by the field generator 16 in circuit with the output of the spin generator 11 while the $H_1$ field applied to cell 15 is produced by the field generator 19 in circuit with the output of the spin generator 12. Each field generator 16 and 19 includes a phase-stable amplifier for receiving and amplifying the output of its respective photodetector, and a field coil oriented with respect to the absorption cell which produces an $H_1$ field along the axis of the field coil and perpendicular to the $H_o$ field.

The alternating magnetic field $H_1$ has the effect of applying a torque to the net magnetic moment of the mercury in the absorption cell, causing it to tilt away from the $H_o$ field and to process about the axis of the $H_o$ field at the frequency of the applied $H_1$ field. The Larmor precessional frequency is given by:

$$\omega = -\gamma H_o \qquad (4)$$

where $\omega$ is the Larmor precession frequency, $\gamma$ is the gyro magnetic ratio, and $H_o$ is the applied DC magnetic field. The negative sign in equation (4) demonstrates that a nucleus with a positive gyromagnetic ratio will precess in a counter-clockwise direction when viewed along a direction parallel to the direction of $H_o$, i.e., according to the left-hand rule with the thumb in the direction of $H_o$ and the fingers in the direction of $\omega$.

The precessing magnetic moment will have a component which is perpendicular to the $H_o$ field and may be considered to rotate about the axis of the $H_o$ field.

The readout beams 38 and 37 pass through respective half wavelength plates to the mercury cells 14 and 15, respectively, and the angle of the plane of polarization is modulated at the precessional frequency by the Faraday effect on the readout beam caused by the perpendicular or transverse magnetic moment component rotating about the $H_o$ axis. The modulation of the angle of the plane of polarization of the readout beam 38 is converted to an amplitude modulation by passing the polarization modulated beam through the linear analyzer 42 and the amplitude modulation is detected in the photomultiplier 43. Similarly, the readout beam 37 is polarization modulated in the mercury cell 15 and is passed through the linear analyzer 45 and is detected in the photodetector 46. The output current from each of the photodetectors is amplified and used to generate the alternating field $H_1$.

When all of the conditions of loop closure (such as proper gains and no phase shifts) are precisely met, each of the mercury isotopes in the spin generators 11 and 12 will cause the spin generator to oscillate at its respective Larmor precessional frequency as indicated above.

When a beam of plane polarized light having a direction of propagation parallel to a component of magnetization of a magnetized medium is caused to pass through the medium, the plane of oscillation of the light may be rotated through an angle as a result of the Faraday effect. When a plane polarized beam 38 of light is caused to pass through the mercury cell 14, it will be affected by a magnetic moment component rotating at the Larmor frequency about the $H_o$ axis and as a result the angular orientation of the plane of polarization of the light will oscillate with respect to time at the Larmor frequency. Thus, the polarization angle of the light beams 37 and 38 will be modulated by the cells 15 and 14, respectively. The analyzers 45 and 42 convert this polarization angle modulation to intensity modulation. By properly orienting the direction of the analyzers 45 and 42, the components of this intensity modulation at a Larmor frequency can be maximized.

Since two isotopes of mercury are contained within each absorption cell, two such signals are produced by each absorption cell, each having been modulated at the characteristic Larmor precessional frequency in accordance with the gyromagnetic ratio for each isotope. Thus, each output beam is amplitude modulated simultaneously at two frequencies which correspond to each of the characteristic frequencies of the isotopes in the mercury cell.

Thus far, the gyroscope operation has been described for a gyroscope which is fixed in inertial space.

When the gyroscope rotates about the $H_o$ axis, the phase relationships are affected in accordance with equation (1) above. That is, the relative phase of the signal at each frequency at the output of each spin generator after rotation is displaced in phase from the signal which would have been received under non-rotation conditions. This relative displacement is thus used to provide an output representative of the degree of rotation of the gyroscope.

The readout lamp 35 as shown in FIG. 2 is in preferred practice an electrodeless r-f excited dumbbell shaped device having an intermediate elongated portion filled with plasma. Since the readout beam originates from an extended source, any changes in this source may produce beam division and beam direction effects in the gyro which are major sources of rate bias instability. As previously mentioned, changes in the light source are due mainly to plasma shifts in the lamp.

Referring to FIG. 2, there is shown a diagram of the light translation problems which the present invention addresses.

When the readout lamp 35 is normally positioned in location 50, there is an even division of beam intensity reaching absorption cells 14 and 15. However, due to the reasons mentioned, the plasma in the readout lamp may undergo translation to a new location as indicated by 52. In this new position beam 38 will move counter-clockwise, as indicated by reference numeral 54, while beam 37 moves to a new location as indicated by reference numeral 58. The point of intersection 56 between the center of the newly directed readout beam and beam splitting polarizer 40 produces the beams 54 and 58 of unequal intensity because the reflection coefficient of the beam splitting polarizer changes. This change in the beam intensity division causes a rate bias shift which requires correction. Since the beams have finite angular widths, the variable reflection coefficient of the splitter 40 causes the effective shifts in the directions of the two beams to be unequal, also leading to rate changes.

Figure 3:
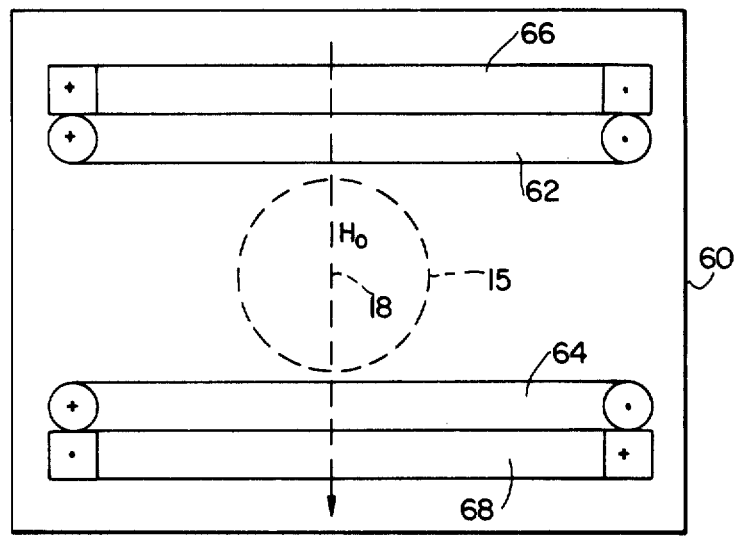
FIG. 3 is a diagrammatic view of the main $H_o$ field coil and an auxiliary field coil, as utilized in the present invention.
Figure 4:
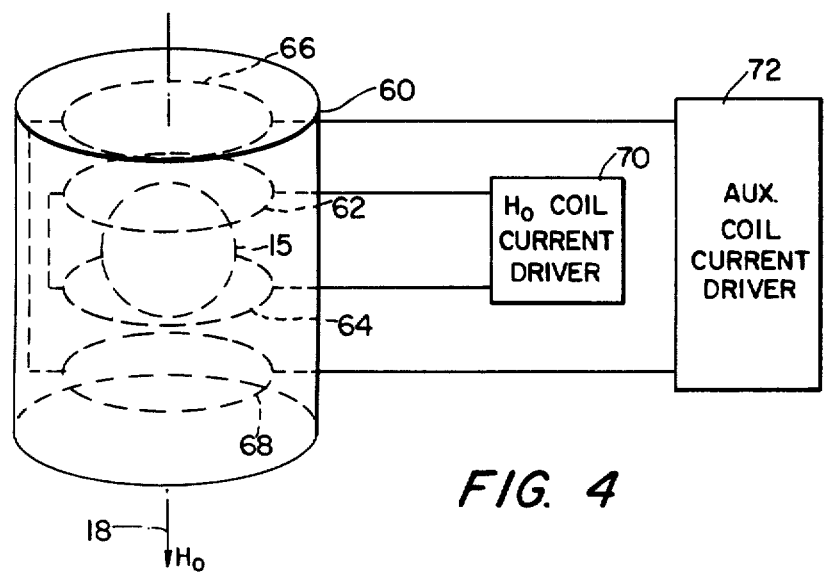
FIG. 4 is a perspective view illustrating the relative disposition of the main and auxiliary coils within a shielded can.

Referring to FIGS. 3 and 4, a shielded can 60 is illustrated for enclosing absorption cell 15. A similar can would enclose absorption cell 14. Series connected coils 62 and 64 of modified Helmholtz type conduct DC current therethrough for generating the $H_o$ field 18, previously mentioned in connection with FIG. 1. The conventional dot (•) and plus sign (+) symbols indicate the direction of the current flow through coils 62 and 64 as being out from the plane of the paper on the right end of the coils, and into the plane of the paper on the opposite ends. This generates the indicated direction for the $H_o$ field, utilizing the right-hand rule. The spacing between coils 62 and 64 is changed from the normal Helmholtz spacing to compensate for the effects of the shielding enclosure 60, yielding better homogeneity for the shielded assembly.

The auxiliary coils 66 and 68 also of the modified Helmholtz type, are mounted in proximity to the series connected coils 62 and 64. Auxiliary coils 66 and 68 are connected in series but the current flow through these coils is in opposite directions. Thus, the DC field generated by auxiliary coil 66 adds to the component of the H$_o$ generated by coil 62 but the DC field generated by auxiliary coil 68 subtracts from the H$_o$ component generated by coil 64. The opposing current flow in coil 64 and auxiliary coil 68 is indicated by the symbols denoting current flow in and out of the plane of the paper in FIG. 3. The result is a controllable inhomogeneity of the H$_o$ field along the axis of the shielded can 60. It is this controlled inhomogeneity which does correct the plasma translation error of the readout lamp. It will be noted that the absorption cell 15 is located in the center of the shielded can 60 although FIGS. 3 and 4 are not intended to represent true dimensional relationships between the illustrated coils and the absorption cells. An identical configuration of coils within a shield can exists for absorption cell 14.

Current drivers 70 and 72 respectively drive the H$_o$ coils and auxiliary coils. These drivers are conventional regulated power supply current drivers.

The amount of current delivered by auxiliary coil current driver 72 to correct the plasma translation problem may be determined empirically. For example, it is possible to translate the readout lamp 35 by placing a mechanical shim against the housing for lamp 35 which will translate the housing so as to produce a reproducible translation in space of the entire readout light assembly. Based on the magnitude of mechanical translation, one measures the change in gyro rate. Then, the auxiliary coils associated with one of the cells are provided with increasing current until the gyro rate change approaches zero. If, after delivering current to an auxiliary coil, the gyro rate change with lamp translation worsens, then the auxiliary coil corresponding to the other absorption cell is driven instead. Thus, by driving the auxiliary coils around one or the other of absorption cells 14, 15, a current level may be determined which solves the plasma translation problem.

Now that a preferred embodiment has been discussed which creates an inhomogeneous H$_o$ field through one of the absorption cells 14, 15, the theory relating to the plasma translation theory will be discussed.

The rate bias equation associated with inner loop mechanical phase angle errors is given by $$\omega_B = \frac{1}{2(\gamma_1 + \gamma_2)} \left[ \Delta\phi_{1AM}\frac{\gamma_2}{\tau_{1A}} + \Delta\phi_{2AM}\frac{\gamma_1}{\tau_{2A}} + \Delta\phi_{2BM}\frac{\gamma_1}{\tau_{2B}} + \Delta\phi_{1BM}\frac{\gamma_2}{\tau_{1B}} \right]$$

where subscripts 1, 2 are mercury isotope labels; subscripts A, B are corresponding labels for spin generators 11 and 12; M refers to mechanical as opposed to electronic phase angles; $\gamma_1$ and $\gamma_2$ are the absolute magnitudes of the gyromagnetic ratios for the two mercury isotopes in the absorption cells 14 and 15; $\tau_{ij}$ is the transverse relaxation time for isotope i (i = 1, 2) in spin generator j (j = A, B), and $\omega_B$ is the rate bias due to these error sources. The mechanical phase angle changes are $\Delta\phi_{ijM}$. Mechanical phase angles represent differences from 90° of the angle between the effective or mean direction of each readout beam and the direction of its respective H$_1$ field. The change in mechanical phase angle, due to a lamp plasma shift, is the same for both isotopes in the same loop, i.e., $$\Delta\phi_{1AM} = \Delta\phi_{2AM} = \Delta\phi_{AM}$$

and $$\Delta\phi_{1BM} = \Delta\phi_{2BM} = \Delta\phi_{BM}.$$

Thus, the equation becomes $$\omega_B = \frac{1}{2(\gamma_1 + \gamma_2)} \left[ \Delta\phi_{AM}\left(\frac{\gamma_1}{\tau_{2A}} + \frac{\gamma_2}{\tau_{1A}}\right) + \Delta\phi_{BM}\left(\frac{\gamma_1}{\tau_{2B}} + \frac{\gamma_2}{\tau_{1B}}\right) \right]$$

In order that $\omega_B = 0$, the relationship between $\Delta\phi_{AM}$ and $\Delta\phi_{BM}$ and the $\tau$'s must be:

$$\frac{\left[\frac{\gamma_1}{\tau_{2B}} + \frac{\gamma_2}{\tau_{1B}}\right]}{\left[\frac{\gamma_1}{\tau_{2A}} + \frac{\gamma_1}{\tau_{1A}}\right]} = -\frac{\Delta\phi_{AM}}{\Delta\phi_{BM}}$$

By driving one of the auxiliary coils, which creates an inhomogeneous H$_o$ field, either the numerator or the denominator of the last expression will be changed due to a reduction of the relaxation times corresponding to the auxiliary coils being driven with current. The directional effects of lamp plasma shifts are completely compensated for when the ratios appearing in the last expression are equated. These ratios are both close to unity, but as noted previously, $-\Delta\phi_{AM}$ will not be exactly equal to $\Delta\phi_{BM}$ *because of the finite beam widths interacting with the variable reflectance of the beam splitter.*

In addition to allowing the beam direction errors to be compensated, this adjustment also provides compensation for the beam-intensity-division differential-light-induced-frequency-shift errors arising from lamp plasma translations. In achieving the translation null rate shift by inhomogeneity trim, one error offsets the other so their sum is nulled.

Figure 5:
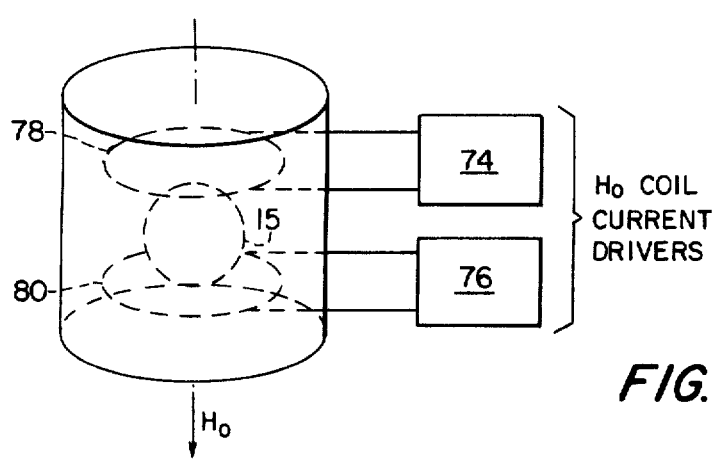
FIG. 5 is a perspective view illustrating an alternate embodiment of the invention utilizing a pair of spaced coils within a shielded can.

An alternate embodiment for achieving the inhomogeneous H$_o$ field is to employ a single set of Helmholtz coils 78 and 80, as shown in FIG. 5, for generating the H$_o$ field. Such a structure could be employed in connection with each absorption cell 14 and 15. Each of the coils 78 and 80 is provided with a separate current driver (74, 76) so that different levels of current drive the coils. This would create an inhomogeneous H$_o$ field through the absorption cells. The current differential is adjusted empirically, as in the case of the structure shown in FIG. 4, until the gyro rate change due to plasma shift approaches zero.

An alternate approach to solution of plasma shift error is to introduce a differential temperature between the absorption cells 14 and 15 and thereby tune the relaxation times in the two cells. Utilizing this approach, the H$_o$ field may be uniform or, a temperature differential could be employed in conjunction with an inhomogeneous H$_o$ field.

Accordingly, a number of approaches have been disclosed which successfully cure the problem of readout lamp plasma shifts which would ordinarily cause rate bias instability. With this problem eliminated, the output of a nuclear magnetic resonance gyroscope is more error free.

It should be understood that the invention is not limited to the exact details of construction shown and described herein for obvious modifications will occur to persons skilled in the art.

I claim:

1. In a magnetic resonance gyro having first and second field generators, first and second detectors, first and second analyzers, a pumping lamp, first and second mirrors, first and second polarizers, a plasma containing readout lamp and first and second absorption cells for receiving light generated by the lamp, the gyro also having apparatus comprising:
    a first coil located adjacent an absorption cell for generating a DC $H_o$ field through the cell; and
    a second coil located in spaced proximate relation to the first coil for completing an inhomogeneous $H_o$ field in the cell, and driven with sufficient current wherein rate bias instability due to lamp translation effects is substantially compensated.

2. The subject matter set forth in claim 1 wherein said apparatus includes third and fourth coils which are respectively located adjacent the first and second coils, the third and fourth coils having a current driver and being series connected to generate a uniform $H_o$ field therebetween, the first and second coils having a current driver and being series connected in opposition to each other wherein the field generated by the third coil is in the same direction as that of the first coil and further wherein the field of the fourth coil is in opposition to the field of the second coil.

3. The subject matter set forth in claim 1 wherein said apparatus includes first and second DC current driving means for enabling each coil to operate with different current levels and includes a shielded cover enclosing said coils.

4. In a magnetic resonance gyroscope having first and second field generators, first and second detectors, first and second analyzers, a pumping lamp, first and second mirrors, first and second polarizers, the apparatus comprising:
    a plasma readout lamp for generating a beam;
    first and second absorption cells; and means generating an inhomogeneous $H_o$ DC field through at least one of the cells of such magnitude as to substantially compensate for rate bias instability due to readout lamp plasma shifts.

5. The subject matter set forth in claim 4 wherein the generating means comprises:
    a first coil located adjacent an absorption cell for generating a DC $H_o$ field through the cell; and
    a second coil located in spaced proximate relation to the first coil for completing an inhomogeneous $H_o$ field in the cell.

6. The subject matter set forth in claim 5 wherein third and fourth coils are respectively located adjacent the first and second coils, the third and fourth coils being series connected to generate a uniform $H_o$ field therebetween, the first and second coils being series connected in opposition to each other wherein the field generated by the third coil is in the same direction as that of the first and further wherein the field of the fourth coil is in opposition to the field of the second coil.

7. The subject matter set forth in claim 5 together with first and second DC current driving means for enabling each coil to operate with different current levels.

8. In a magnetic resonance gyroscope having first and second field generators, first and second detectors, first and second analyzers, a pumping lamp, first and second mirrors, first and second polarizers, a plasma filled readout lamp and first and second Hg isotope absorption cells, the gyroscope also having a coil assembly positioned adjacent at least one cell for generating an inhomogeneous $H_o$ field through the cells for reducing the rate bias instability due to lamp plasma shifts, wherein $$\frac{\gamma_1}{\tau_{2B}} + \frac{\gamma_2}{\tau_{1B}}$$

is substantially equal to $$\frac{\gamma_1}{\tau_{2A}} + \frac{\gamma_2}{\tau_{1B}}$$

where subscripts 1, 2 are labels for two mercury isotopes in the absorption cells; subscripts A, B are corresponding labels for the absorption cells;
    $\gamma_1$ and $\gamma_2$ are the absolute magnitudes of the gyromagnetic ratios for the two mercury isotopes in the absorption cells; and
    $\tau_{ij}$ is the transverse relaxation time for isotope i (i = 1, 2) in absorption cell j (j = A, B).

9. In a magnetic resonance gyroscope having first and second field generators, first and second detectors, first and second analyzers, a pumping lamp, first and second mirrors, first and second polarizers, a plasma filled readout lamp, first and second absorption cells, and experiencing rate bias instability due to lamp plasma shifts, a method for reducing said instability including the step of generating an inhomogeneous $H_o$ field across an absorption cell of the gyro wherein $$\frac{\gamma_1}{\tau_{2B}} + \frac{\gamma_2}{\tau_{1B}}$$

is substantially equal to $$\frac{\gamma_1}{\tau_{2A}} + \frac{\gamma_2}{\tau_{1B}}$$

where subscripts 1, 2 are labels for two mercury isotopes in the absorption cells; subscripts A, B are corresponding labels for the absorption cells;
    $\gamma_1$ and $\gamma_2$ are the absolute magnitudes of the gyromagnetic ratios for the two mercury isotopes in the absorption cells; and
$\tau_{ij}$ is the transverse relaxation time for isotope i (i = 1, 2) in absorption cell j (j = A, B).

10. In a magnetic resonance gyroscope having first and second field generators, first and second detectors, first and second analyzers, a pumping lamp, first and second mirrors, first and second polarizers, at least two absorption cells and a plasma filled readout lamp, a method for reducing rate bias instability due to plasma shifts including the step of producing a predetermined temperature differential between the cells.

* * * * *